United States Patent [19]

Chang

[11] Patent Number: 5,028,556
[45] Date of Patent: Jul. 2, 1991

[54] PROCESS FOR FABRICATING RADIATION HARD HIGH VOLTAGE DEVICES

[75] Inventor: Chen-Chi P. Chang, Newport Beach, Calif.

[73] Assignee: Hughes Aircraft Company, Los Angeles, Calif.

[21] Appl. No.: 481,149

[22] Filed: Feb. 16, 1990

[51] Int. Cl.⁵ .......................................... H01L 21/335
[52] U.S. Cl. .............................. 437/57; 437/44; 437/84; 437/62; 437/982; 148/DIG. 150
[58] Field of Search ................ 437/44, 84, 45, 60, 437/62, 982, 57, 58; 148/DIG. 150, 130; 357/23.7, 23.11

[56] References Cited

U.S. PATENT DOCUMENTS

| 4,786,955 | 11/1988 | Plus et al. | 357/23.7 |
| 4,950,617 | 8/1990 | Kumagai et al. | 437/41 |
| 4,968,639 | 11/1990 | Bergonzoni | 437/57 |

FOREIGN PATENT DOCUMENTS

| 57-192078 | 11/1982 | Japan | 437/44 |
| 59-78566 | 5/1984 | Japan | 437/44 |

OTHER PUBLICATIONS

Wolf, S. et al., Silicon Processing, Laffice Press, 1986, pp. 295-308.

Primary Examiner—Brian E. Hearn
Assistant Examiner—T. N. Quach
Attorney, Agent, or Firm—Terie Gudmestad; Jeannette M. Walder; W. K. Denson-Low

[57] ABSTRACT

A radiation hard, high voltage integrated circuit device fabrication process. A silicon substrate is implanted with ions that form a buried layer and an epitaxial layer of silicon is grown thereover. The structure is heated to form adjacent N- and P-channel regions. Channel stops are then formed surrounding the respective channel regions. After forming the channel stops, the substrate is masked and predefined dopant ions are implanted into the source and drain regions of the respective wells in the substrate. The distribution of the dopant ions therein are adjusted to have a predetermined doping profile that defines a graded junction. Then the substrate is heated to a relatively high temperature to provide a high temperature drive cycle that forms a desired graded junction profile. A field oxide layer is then deposited on the substrate, and it is masked and etched to define active areas. A gate oxide layer is grown on the substrate above the active areas, and polysilicon gates are formed thereon. Finally, dopant ions are implanted into source and drain regions using the polysilicon gates and field oxide layer as a mask. This forms the completed semiconductor devices. The devices fabricated using this process have N+ (source and drain regions) to P-well and complementary P+ to N-well junction breakdown voltages in the 10-12 volt range, and the radiation performance of the devices is not degraded.

14 Claims, 5 Drawing Sheets

PROCESS FOR FABRICATING RADIATION HARD HIGH VOLTAGE DEVICES

BACKGROUND

The present invention relates generally to CMOS integrated circuit devices and processes, and more particularly, to an improved radiation hard, high voltage analog CMOS device fabrication process.

Some military applications require integrated circuit devices that have a relatively high operating voltage and that operate in a radiation environment. For example, focal plane array devices require high voltage clock bias circuits operating at voltages of at least 15 V. In addition, some focal plane array devices must operate in a radiation environment. Presently available integrated circuit devices fabricated with conventional radiation hard CMOS processes are typically limited to operation at a voltage of 10 V or less, due to relatively low N+ to P-well junction breakdown voltages.

The conventional procedure for fabricating these devices typically involves providing a silicon substrate having a first conductivity type, and forming first well regions having a second conductivity type in the substrate. This is achieved by masking and depositing dopant ions into the surface of the substrate, epitaxially growing silicon on top of the doped substrate and then heating the substrate to form a buried layer that defines second conductivity type wells. Second well regions are defined adjacent to the first well regions. Channel stops are then formed surrounding the P-and N-channel regions. A field oxide layer is deposited on the substrate, and it is masked and etched to define active areas. A gate oxide layer is grown on the substrate above the active areas, and polysilicon gates are formed thereon. Finally, dopant ions are implanted through the field oxide layer and into source and drain regions using the polysilicon gates and field oxide layer as a mask. The devices fabricated using this process have N+ (source and drain regions) to P-well junction breakdown voltages in the 10–12 volt range.

Accordingly, it would be an advance in the integrated circuit processing art to have an improved analog CMOS process that provides for radiation hard, high voltage integrated circuit devices having junction breakdown voltages above 12 volts. It is therefore an objective of the present invention to provide a fabrication process for integrated circuit devices that operate at relatively high voltages. Another objective of the present invention is to provide a process of fabricating integrated circuit devices that are radiation hard.

SUMMARY OF THE INVENTION

In accordance with these and other objectives and advantages, the present invention provides for a radiation hard, high voltage integrated circuit device fabrication process. In accordance with the invention, the conventional process for fabricating radiation hardened high voltage CMOS integrated circuit devices described above is modified to add the following processing steps. In particular, after forming the channel stops and prior to forming the gate oxide layer, the substrate is masked and predefined dopant ions are implanted into the source and drain regions of the respective wells in the substrate. The distribution of the dopant ions therein are adjusted to have a predetermined doping profile that defines a graded junction. Then the substrate is heated to a relatively high temperature, on the order of 1000 degrees Celsius, and for a predetermined time period, on the order of 120 minutes, in order to form the desired graded junction profile.

Consequently, by forming the graded junctions prior to the growth of the gate oxide layer and implanting the source and drain regions, the voltage breakdown level is increased between the source and drain regions of the first channel and the well region thereof, and between the source and drain regions of the second channel and the substrate, respectively. The operating voltage of the devices fabricated in accordance with the present method is increased to greater than 12 V and the device radiation performance is not degraded. The use of the N-grade and P-grade diffusions, and high temperature drive cycle prior to gate oxide growth increases the N+ and P+ diode breakdown voltage to the P-well and the N− substrate, respectively.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
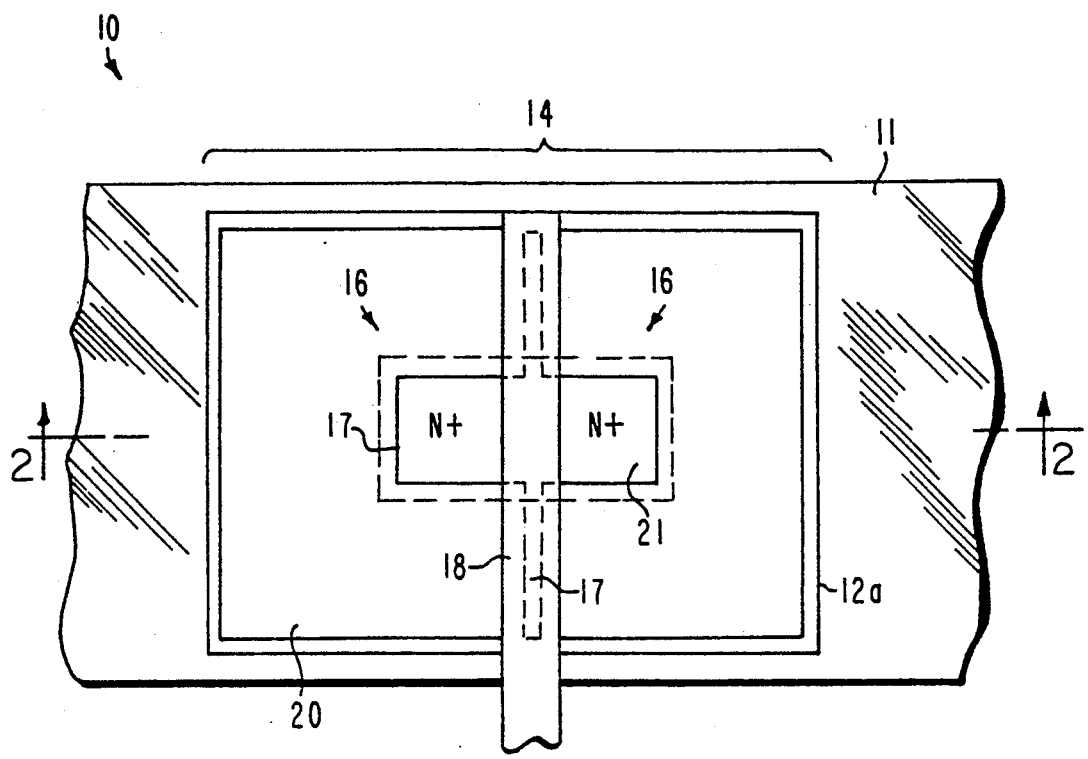
FIGS. 1 and 2 show top and cross sectional side views, respectively, of a radiation hard integrated circuit fabricated using a conventional process.
Figure 2:
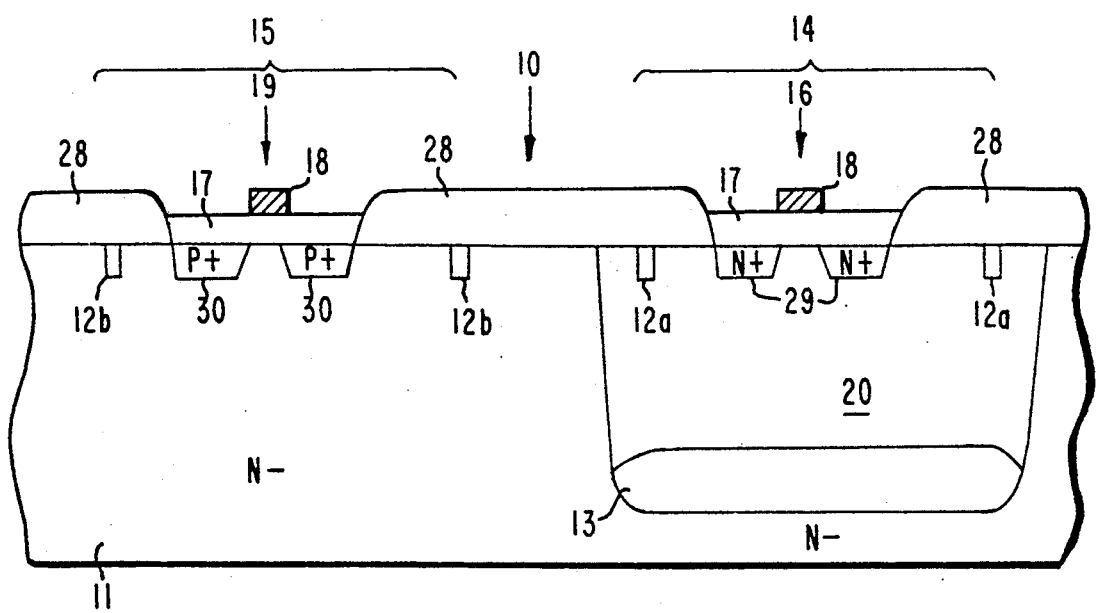

Referring now to FIGS. 1 and 2, there is shown top and cutaway side views, respectfully, of a section of a conventional radiation hard integrated circuit 10 fabricated using a device fabrication process. An N− substrate 11 comprising silicon for example, is masked and implanted with P+ ions, such as positively charged Boron ions, for example, to form a buried layer 13 (shown in FIG. 2) that defines a subsequently formed P-well 20. Silicon is then epitaxially grown on top of the substrate 11 and buried layer 13. The substrate 11 is masked and implanted with P+ ions such as positively charged boron ions, for example, to form P-well regions, and heated to a relatively high temperature (about 1000° C.) for a fixed time (about several hours) to drive the P+ atoms adjacent to the buried P+ layer underneath.

A P-channel stop 12a that surrounds the N-channel region 14, is formed in the substrate 11 by masking and implanting boron ions into the substrate 11. Similarly, an N-channel stop 12b is formed surrounding the P-channel region 15. The channel stops 12a, 12b are adapted to increase the field threshold voltage and inhibit device latch-up. A field oxide layer 28 (shown in FIG. 2) is deposited on the surface of the substrate 11, and is then masked and etched to define active areas 16, 19. A layer of silicon oxide comprising a gate oxide layer 17 is formed over the active area 16, 19.

A polysilicon layer is then deposited over the surface of the substrate 11 and it is masked and etched to form a polysilicon gates 18. The substrate 11 is then masked with a photoresist material and the active areas 16 are implanted with N-type dopant ions, such as phosphorus, for example, through the layer of gate oxide layer 17 to form N+ source and drain regions 29. In a similar manner, the substrate 11 is again masked with a photoresist material and the active areas 19 are implanted with P-type dopant ions, such as boron, for example, through the layer of gate oxide layer 17 to form P+ source and drain regions 30.

Figure 3:
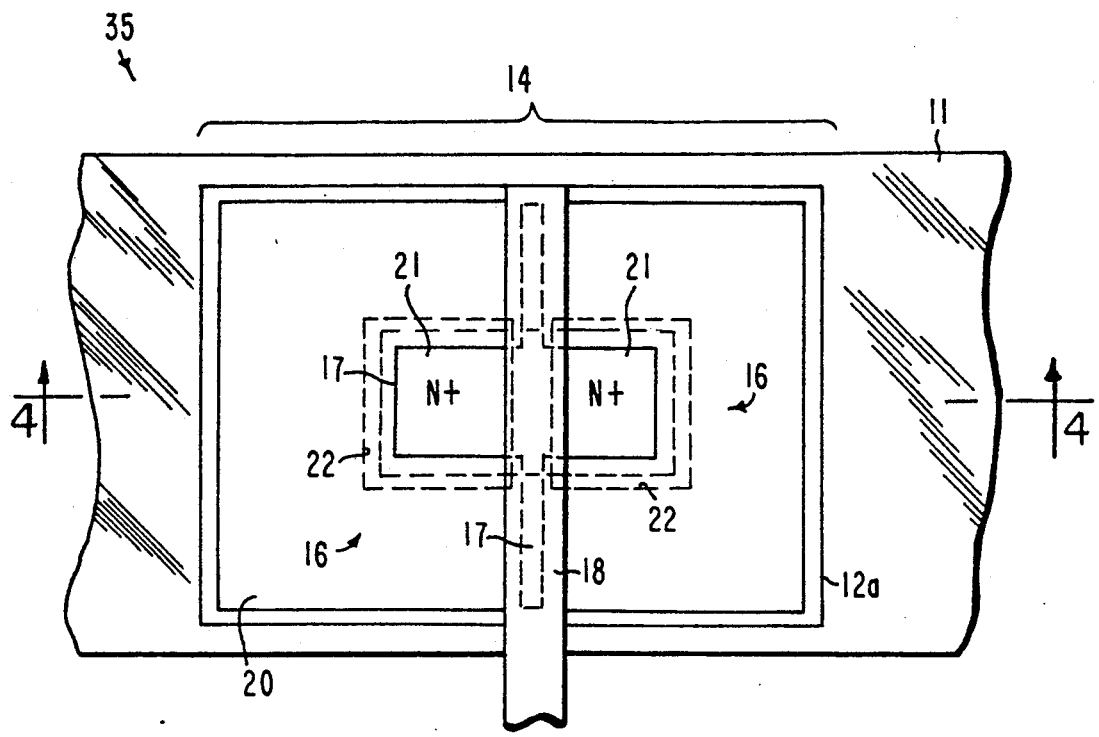
FIG. 3 shows a top level view and FIGS. 4a–4j show various process steps of a radiation hard, high voltage integrated circuit fabricated using a process in accordance with the principles of the present invention.

Referring now to FIGS. 3 and 4, top and side cutaway views, respectively, of a radiation hard high voltage integrated circuit 35 fabricated using a process in accordance with the principles of the present invention is shown. As in the conventional process, the N− substrate 11 is masked and implanted with P-type ions to form the buried layer that defines the subsequently formed P-wells 20 (FIG. 4a). Silicon is epitaxially grown on top of the substrate 11 and buried layer 13 (FIG. 4b). The substrate is masked and implanted with P+ ions such as positively charged boron ions, for example, to form P-well regions, and heated to a high temperature for a fixed time to drive the boron atoms adjacent the buried layer (FIG. 4c). The channel stops 12a, 12b that surround the N- and P-channel regions 14, 15 are then formed as described above and as shown in FIGS. 4d and 4e.

Figure 4J:
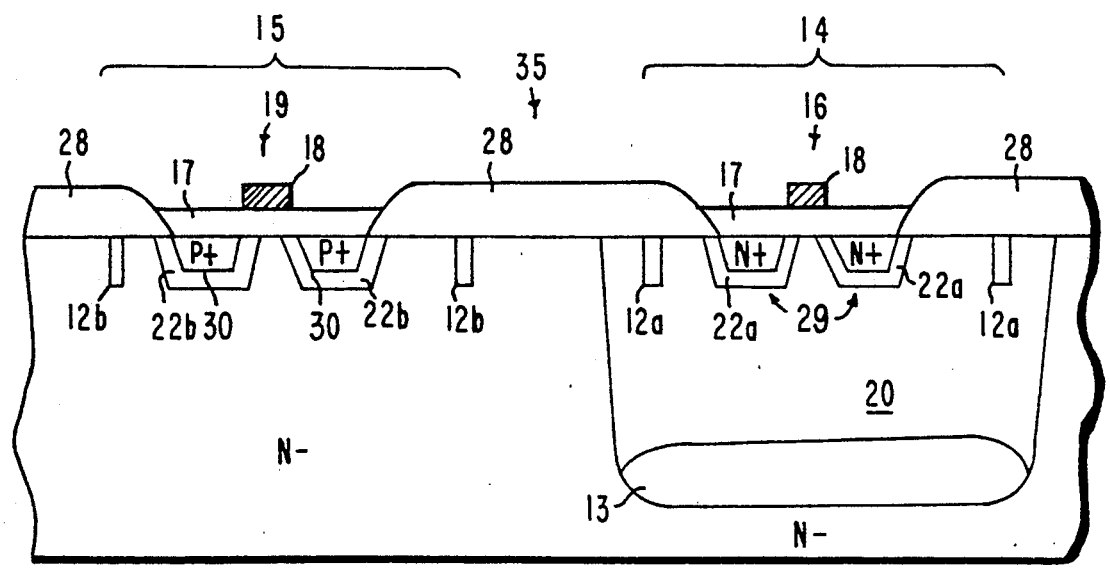
Figure 4A:
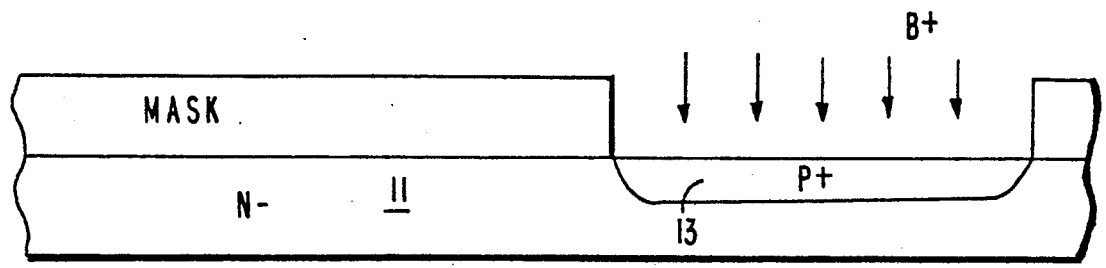
Figure 4B:
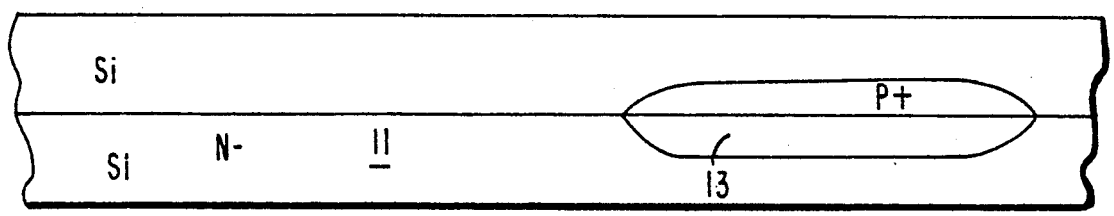
Figure 4C:
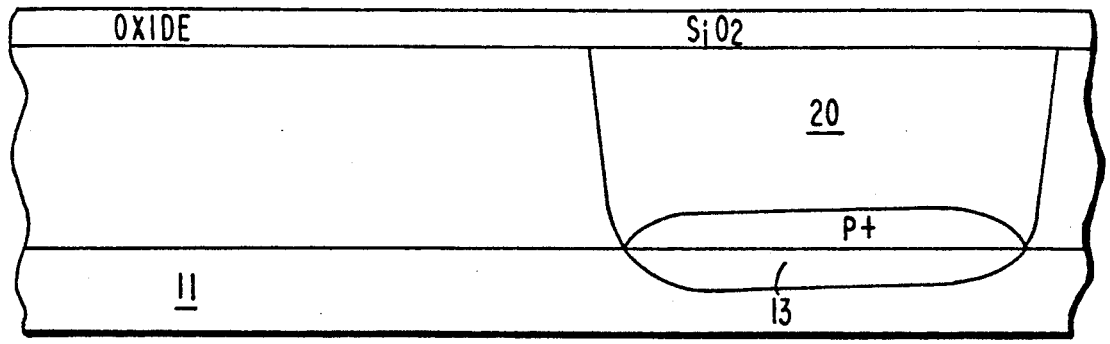
Figure 4D:
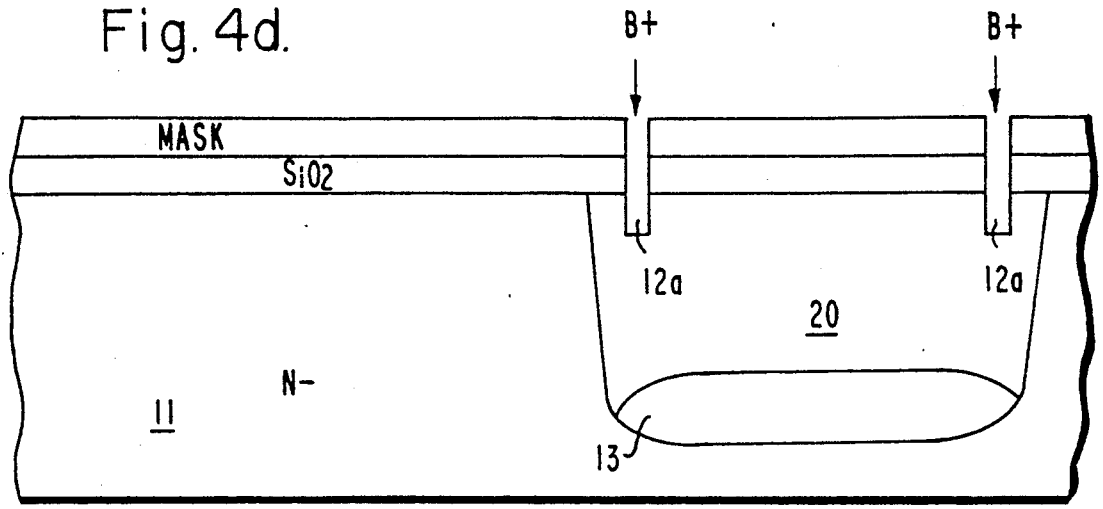
Figure 4E:
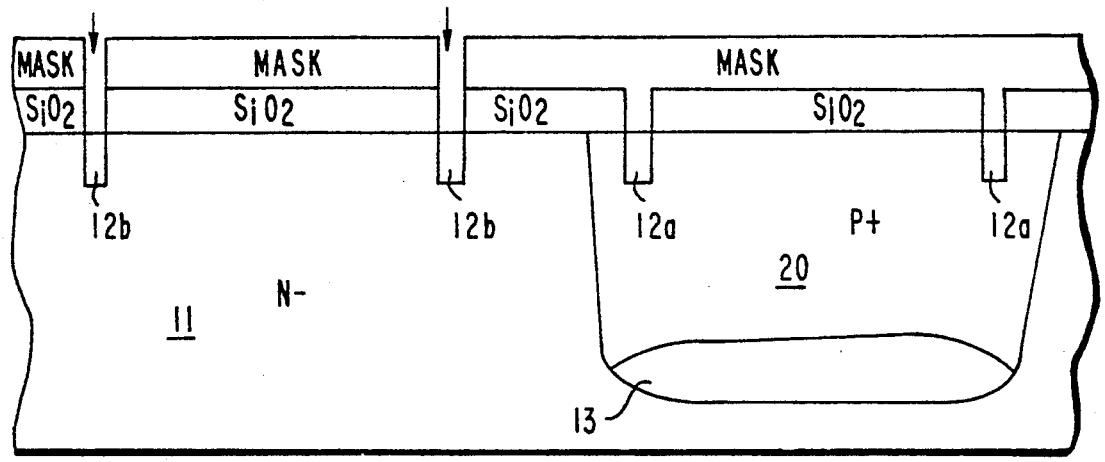
Figure 4F:
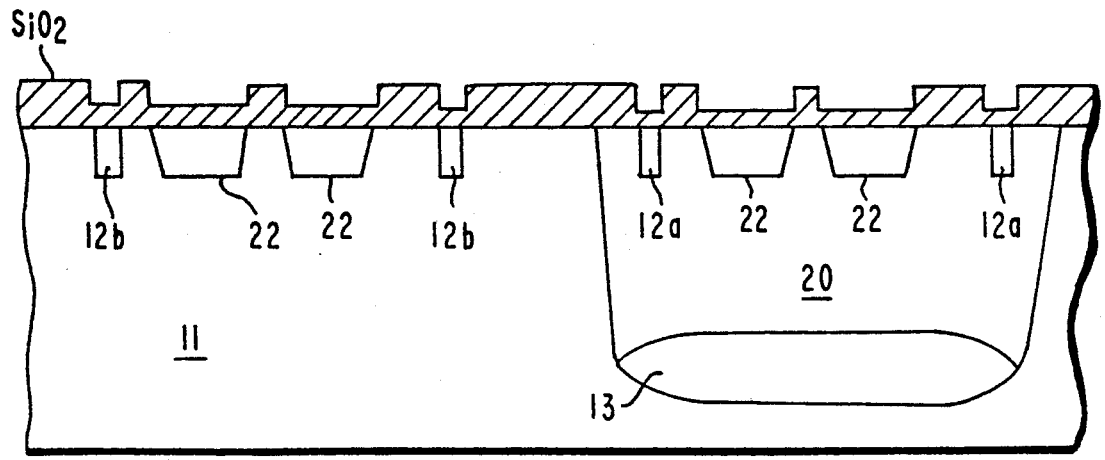

In accordance with the principles of the present invention, the surface of the P-well regions 14 is then masked with an N-grade mask, and regions 22a are implanted with N-type ions (FIG. 4f). This implantation step provides for lightly doped N-regions. In a similar manner the surface of the P-channel regions 15 are then masked with a P-grade mask, and regions 22a are implanted with P-type ions. This implantation step provides for lightly doped P+ regions. The implants are controlled to provide for a predetermined doping profile that defines a graded junctions 22a and 22b. After the graded junctions are implanted, the substrate 11 is heated to a relatively high temperature. This temperature is approximately 1050 degrees Celsius for about 31 minutes to form the desired graded junction profile. This heating step comprises a high temperature drive cycle that forms the graded junctions.

Figure 4G:
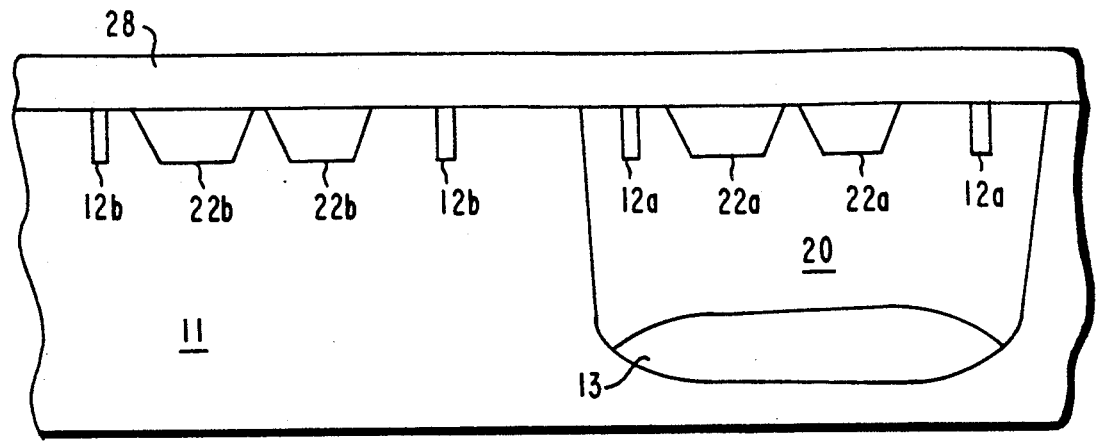
Figure 4H:
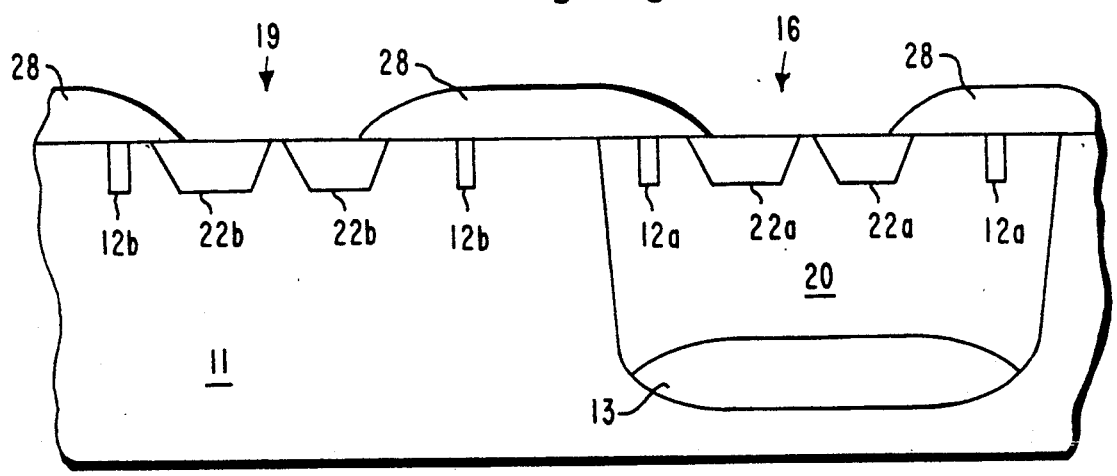
Figure 4I:
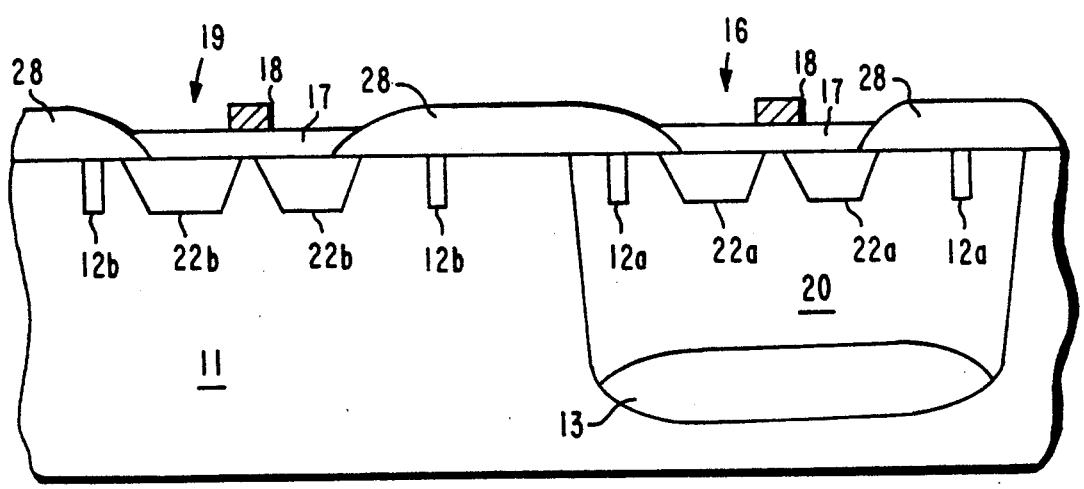

The field oxide layer 28 is then deposited on the surface of the substrate 11, and is masked and etched to define the active areas 16, 19 (FIGS. 4g, 4h). A layer of silicon oxide comprising the gate oxide layer 17 is formed over the active areas 16, 19. A polysilicon layer is then deposited over the surface of the substrate 11 and it is masked and etched to form the polysilicon gates 18 (FIG. 4i). The substrate 11 is then masked with a photoresist material (not shown) and the active areas 16 are implanted with N-type dopant ions through the layer of gate oxide layer 17 to form N+ source and drain regions 29 in graded region 22a. In a similar manner, the substrate 11 is again masked with a photoresist material and the active areas 19 are implanted with P-type dopant ions through the layer of gate oxide layer 17 to form P+ source and drain regions 30 in graded region 22b (FIG. 4j). Referring to FIG. 4j, it can be seen that the graded regions 22a and 22b extend laterally around and underneath source and drain regions 29 and 30, respectively.

With devices fabricated using the conventional radiation hard integrated circuit fabrication method, the relatively low N+ to P-well diode breakdown voltage ($\leq$12 V) limits device operating voltages. However, in accordance with the present invention, in order to increase this N+ to P-well diode breakdown voltage, the N-grade mask, N+ ion implantation, and P-grade mask, P+ ion implantation, and the high temperature drive cycle to form N-grade layer over N+ region, and the P-grade layer over the P+ region are added before the actual gate oxide growth. The device hardness is not degraded by these additional steps since there are no process changes after the gate oxide growth. With the N- and P-grade layers, the N+ to P-well, and the P+ to N− substrate diode breakdown voltage is improved to over 15 V.

Thus there has been described a new and improved process for fabricating radiation hardened, high voltage integrated circuit devices. Prior to forming of the gate oxide layer, the substrate is masked and the source and drain regions are lightly doped. The substrate is heated to for a predetermined time to form the desired graded junction profile. The use of the N-grade and P-grade diffusions, and the high temperature drive cycle prior to gate oxide growth increases the N+ and P+ diode breakdown voltage to the P-well and the N− substrate, respectively.

It is to be understood that the above-described process is merely illustrative of some of the many specific processes that represent applications of the principles of the present invention. Clearly, numerous and other varied processes may be readily devised by those skilled in the art without departing from the scope of the invention.

What is claimed is:

1. A process for fabricating radiation hardened high voltage integrated circuit devices, said method comprising the steps of:

providing a substrate having a first conductivity type;

masking and implanting dopant ions having a second conductivity type into selected areas of the substrate to provide buried regions that define the extent of subsequently formed wells comprising first channel regions, the regions adjacent the first channel regions comprising second channel regions;

epitaxially growing a layer of material having the first conductivity type on top of the substrate and buried regions;

heating the substrate to a predetermined temperature and for a predetermined period of time to form wells therein having the second conductivity type;

forming channel stops having the first conductivity type surrounding the first channel regions;

forming channel stops having the second conductivity type surrounding the second channel regions;

masking the substrate and implanting dopant ions having the first conductivity type into first regions of the first channel regions, the distribution of the dopant ions therein having a predetermined doping profile that defines a graded junction;

masking and implanting dopant ions having the second conductivity type into second regions of the second channel regions, the distribution of the dopant ions therein having a predetermined doping profile that defines a graded junction;

heating the substrate to a predetermined relatively high temperature for a predetermined period to time to form the desired graded junction profile;

forming a field oxide layer on the substrate, and masking and etching the field oxide layer to define active areas that include the graded junctions therewithin;

forming a gate oxide layer on the substrate above the active areas;

forming polysilicon gates on the gate oxide layer;

implanting dopant ions having the first conductivity type into the first regions of the first channel regions using the polysilicon gates and field oxide layer as a mask to form source and drain regions in the first regions, wherein the desired graded junction profile extends laterally around and underneath the source and drain regions; and implanting dopant ions having the second conductivity type into the second regions of the second channel regions using the polysilicon gates and field oxide layer as a mask to form source and drain regions in the second regions, wherein the desired graded junction profile extends laterally around and underneath the source and drain regions;

whereby forming the graded junctions prior to forming the gate oxide layer increases the voltage breakdown level between the source and drain regions of the first channel and the well thereof, and between the source and drain regions of the second channel and the substrate, respectively, which increases the operating voltage of the formed integrated circuit devices.

2. The process of claim 1 wherein the first conductivity type is N-type and the second conductivity type is P-type.

3. The process of claim 1 wherein the graded junctions having the first conductivity type are formed by implanting phosphorus ions into the P-well regions.

4. The process of claim 2 wherein the graded junctions having the second conductivity type are formed by implanting boron ions into the substrate.

5. The process of claim 1 wherein the substrate is heated to a first relatively high temperature for a predetermined time period to achieve the desired doping profile.

6. The process of claim 4 wherein the substrate is heated to a second relatively high temperature for a predetermined time period to form the desired graded junctions.

7. The process of claim 4 wherein the substrate is heated to about 1050 degrees Celsius for a time period of about 120 minutes to form the desired graded junctions.

8. In a process for fabricating radiation hardened high voltage integrated circuit devices that comprises the steps of providing a substrate having a first conductivity type, forming first well regions in the substrate having a second conductivity type, defining well regions in the substrate disposed adjacent to the first well regions, the second well regions having the first conductivity type, forming channel stops substantially surrounding the first and second regions, forming a field oxide layer on the substrate, and masking and etching the field oxide layer to define active areas, forming a gate oxide layer on the substrate above the active areas, forming polysilicon gates on the gate oxide layer, and forming source and drain regions in the active areas by implanting dopant ions into the active areas of the first and second channel regions, wherein the improvement comprises the steps of:

prior to forming of the gate oxide layer, masking and implanting predefined dopant ions into the active areas of the substrate within the first and second channel regions, the distribution of the dopant ions therein having a predetermined doping profile that defines a graded junction; and heating the substrate at a predetermined relatively high temperature or a predetermined period of time to form a desired graded junction profile;

whereby forming the graded junctions prior to the deposition of the gate oxide layer increases the voltage breakdown level between the source and drain regions of the first channel and the well region thereof, and the source and drain regions of the second channel and the substrate, respectively, which increases the operating voltage of the formed integrated circuit devices.

9. The process of claim 8 wherein the first conductivity type is N-type and the second conductivity type is P-type.

10. The process of claim 8 wherein the graded junctions having the first conductivity type are formed by implanting phosphorus ions into the P-well.

11. The process of claim 8 wherein the graded junctions having the second conductivity type are formed by implanting boron ions into the substrate.

12. The process of claim 8 wherein the substrate is heated to a first relatively high temperature for a fixed time period to achieve the desired ion distribution.

13. The process of claim 8 wherein the substrate is heated to a second relatively high temperature for a predetermined time period to form the desired graded junctions.

14. The process of claim 8 wherein the substrate is heated to about 1050 degrees Celsius for a time period of about 120 minutes to form the desired graded junctions.

* * * * *